United States Patent
Lee et al.

(10) Patent No.: US 10,448,532 B2
(45) Date of Patent: Oct. 15, 2019

(54) QUICK-RELEASING MECHANISM AND RELATED ELECTRONIC APPARATUS

(71) Applicant: Wistron Corporation, New Taipei (TW)

(72) Inventors: Tung-Ping Lee, New Taipei (TW); Yu-Ling Kuo, New Taipei (TW)

(73) Assignee: Wistron Corporation, New Taipei (TW)

( * ) Notice: Subject to any disclaimer, the term of this patent is extended or adjusted under 35 U.S.C. 154(b) by 67 days.

(21) Appl. No.: 15/867,638

(22) Filed: Jan. 10, 2018

(65) Prior Publication Data

US 2019/0182977 A1 Jun. 13, 2019

(30) Foreign Application Priority Data

Dec. 7, 2017 (TW) .............................. 106142870 A

(51) Int. Cl.
*H05K 7/14* (2006.01)
*G11B 33/00* (2006.01)
*H05K 5/02* (2006.01)

(52) U.S. Cl.
CPC ........... *H05K 7/1401* (2013.01); *G11B 33/00* (2013.01); *H05K 5/0221* (2013.01); *H05K 7/1487* (2013.01); *H05K 7/1489* (2013.01)

(58) Field of Classification Search
CPC ..................... H05K 7/1401; H05K 7/1489
See application file for complete search history.

(56) References Cited

U.S. PATENT DOCUMENTS

| | | | | | |
|---|---|---|---|---|---|
| 7,423,869 B2* | 9/2008 | Su | ........................... | G06F 1/187 | |
| | | | | 312/223.2 | |
| 7,984,883 B2* | 7/2011 | Li | ....................... | H04N 1/00127 | |
| | | | | 108/103 | |
| 2011/0304247 A1* | 12/2011 | Yan | ...................... | H05K 7/1489 | |
| | | | | 312/223.2 | |
| 2012/0293926 A1* | 11/2012 | Duan | .................. | H04M 1/0235 | |
| | | | | 361/679.01 | |

FOREIGN PATENT DOCUMENTS

TW M478055 5/2014

* cited by examiner

*Primary Examiner* — Rockshana D Chowdhury
(74) *Attorney, Agent, or Firm* — Winston Hsu

(57) ABSTRACT

A quick-releasing mechanism is applied to an electronic apparatus. The quick-releasing mechanism includes a central axle, an ejecting component, and a locking component. The ejecting component is slidably disposed on the central axle, and has a supporting portion configured to support a bracket, and a first inclined guiding structure disposed under the supporting portion. The locking component includes a base, a second inclined guiding structure, a pressing portion, and a pushing portion. The base is rotatably disposed on the central axle. The second inclined guiding structure is disposed on the base and slidably abuts against the first inclined guiding structure to lift and lower-down the supporting portion. The pressing portion is disposed on the base to clip the bracket with the supporting portion. The pushing portion is disposed by the base and is pushed for rotation of the base.

18 Claims, 7 Drawing Sheets

QUICK-RELEASING MECHANISM AND RELATED ELECTRONIC APPARATUS

BACKGROUND OF THE INVENTION

1. Field of the Invention

The present disclosure relates to a releasing mechanism and an electronic apparatus, and more particularly, to a quick-releasing mechanism and a related electronic apparatus.

2. Description of the Prior Art

A server apparatus usually includes a plurality of electronic components, such as a hard disk, a network card, a display card or an expansion card. A common example of the conventional electronic component installing method may lock a bridging component with a locking hole on an edge of the hard disk. An external fixing component (such as the screw or the bolt) is inserted into the locking hole of the bridging component and a thread structure of a fastening seat when the hard disk is assembled with the fastening seat inside the server apparatus. An external tool (such as a screw driver or a spanner) is adopted to lock the fixing component to complete assembly of the hard disk. If users need to disassemble the hard disk, the users may adopt the external tool to unlock the fixing component and remove the fixing component from the locking hole of the bridging component, so as to separate the hard disk and the fastening seat. Therefore, the conventional electronic component installing method cannot assemble and disassemble the electronic component rapidly and easily, and has a complicated process for assembly and disassembly.

SUMMARY OF THE INVENTION

The present disclosure provides a quick-releasing mechanism and the related electronic apparatus for solving above drawbacks.

According to the present disclosure, a quick-releasing mechanism includes a central axle, an ejecting component and a locking component. The ejecting component is slidably disposed on the central axle. The ejecting component includes a supporting portion and a first inclined guiding structure; the supporting portion is configured to support the bracket, and the first inclined guiding structure is disposed under the supporting portion. The locking component includes a base, a second inclined guiding structure, a pressing portion and a pushing portion. The second inclined guiding structure is disposed on the base and slidably abuts against the first inclined guiding structure to lift and lower-down the supporting portion. The pressing portion is disposed on the base and configured to clip the bracket with the supporting portion. The pushing portion is disposed on a lateral side of the base. The pushing portion is configured to rotate the locking component and drive the second inclined guiding structure to slide relative to the first inclined guiding structure.

According to the present disclosure, an electronic apparatus includes a fastening seat, a bracket and a quick-releasing mechanism. The bracket is configured to fix at least one storage device. The quick-releasing mechanism is configured to detachably assemble the bracket with the fastening seat. The quick-releasing mechanism includes a central axle, an ejecting component and a locking component. The central axle is disposed on the fastening seat. The ejecting component is slidably disposed on the central axle. The ejecting component includes a supporting portion and a first inclined guiding structure. The supporting portion is configured to support the bracket, and the first inclined guiding structure is disposed under the supporting portion. The locking component includes a base, a second inclined guiding structure, a pressing portion and a pushing portion. The second inclined guiding structure is disposed on the base and slidably abuts against the first inclined guiding structure to lift and lower-down the supporting portion, so as to move the bracket into or out of the fastening seat. The pressing portion is disposed on the base and configured to clip the bracket with the supporting portion. The pushing portion is disposed on a lateral side of the base, and the pushing portion is configured to rotate the locking component and drive the second inclined guiding structure to slide relative to the first inclined guiding structure.

The quick-releasing mechanism and the related electronic apparatus of the present disclosure dispose the ejecting component on the central axle in a slidable manner and further dispose the locking component on the central axle in a rotatable manner. Clockwise and counterclockwise rotation between the locking component and the central axle may lift and lower-down the ejecting component relative to the central axle, and the locking component further includes the pressing portion utilized to clip the bracket with the ejecting component, so the user can push the locking component to rapidly remove and steady the bracket. Assembly of the quick-releasing mechanism and the related electronic apparatus does not use external tools with complicated execution, and can achieve an aim of rapid and automatic operation.

These and other objectives of the resent disclosure will no doubt become obvious to those of ordinary skill in the art after reading the following detailed description of the preferred embodiment that is illustrated in the various figures and drawings.

DETAILED DESCRIPTION

Figure 1:
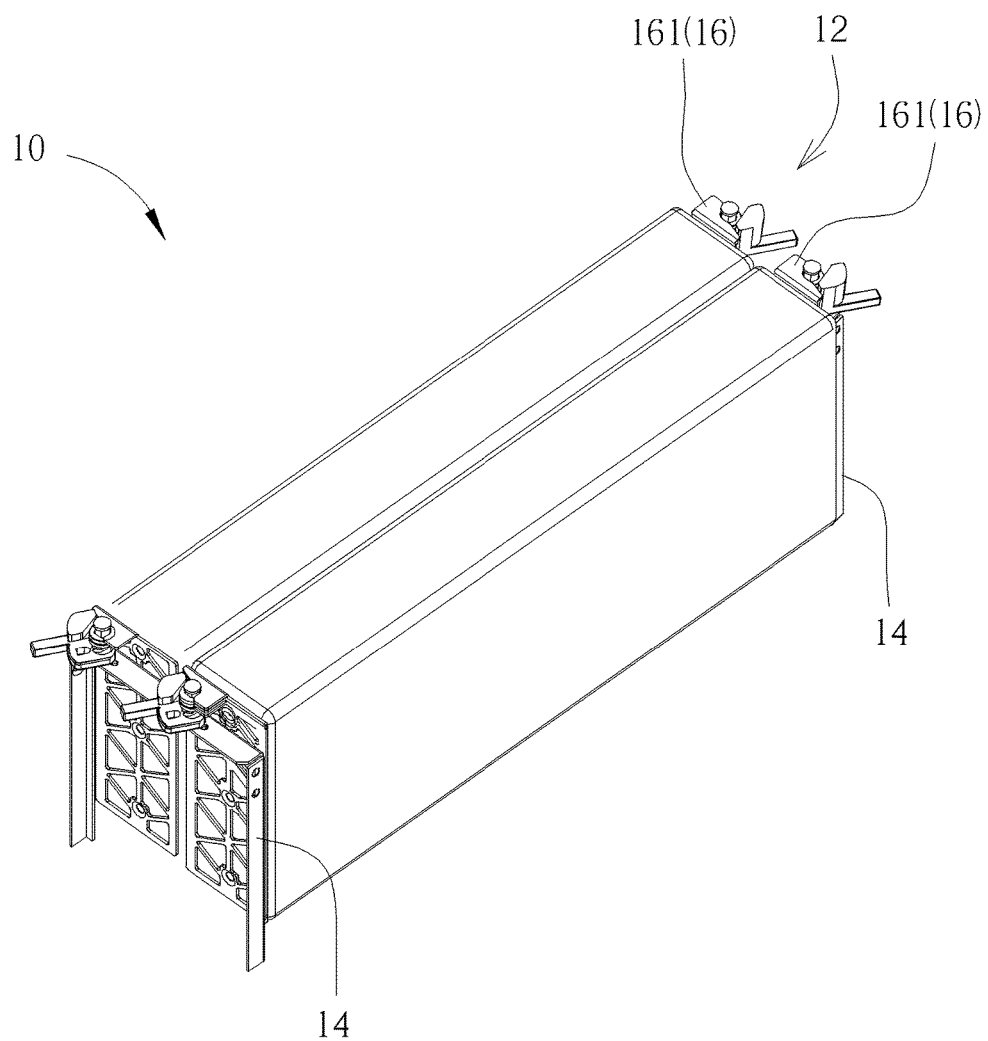
FIG. 1 is a diagram of an electronic apparatus with a quick-releasing mechanism according to an embodiment of the resent disclosure.
Figure 2:
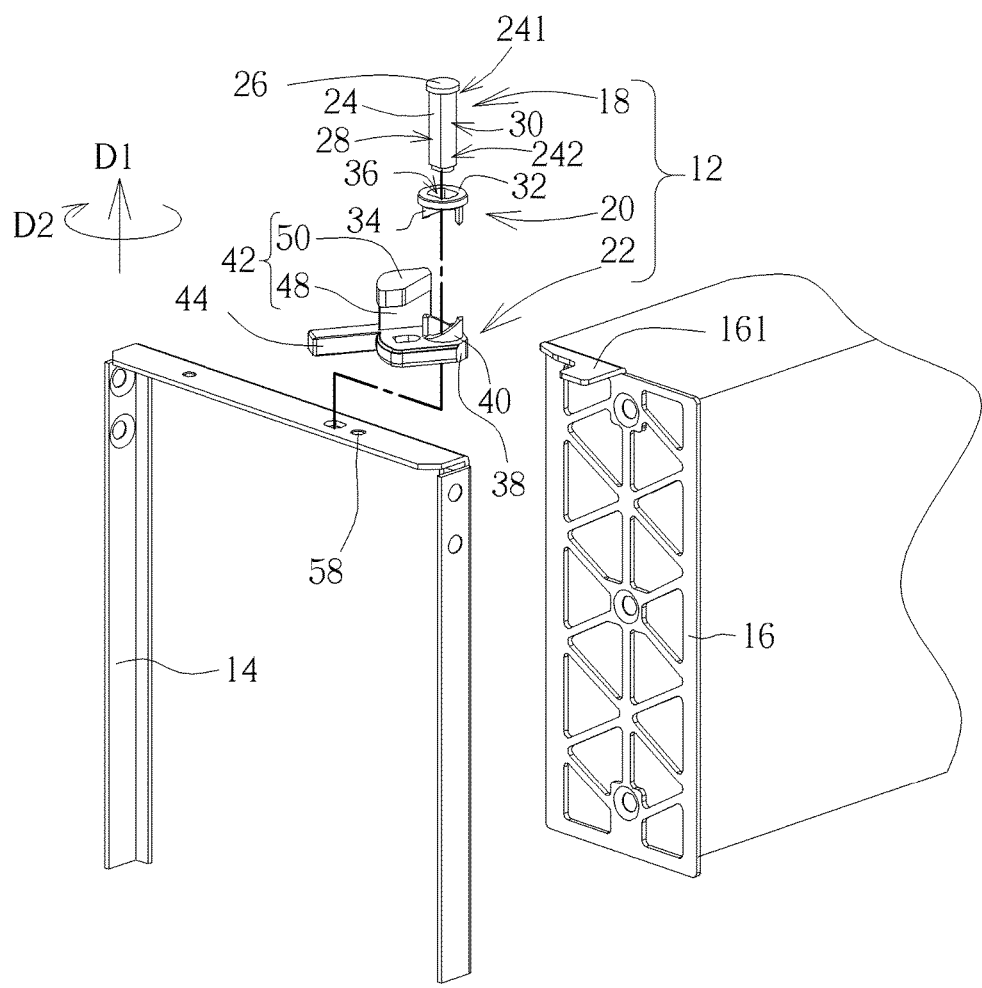
FIG. 2 and FIG. 3 are exploded diagrams of the quick-releasing mechanism in different views according to the embodiment of the present disclosure.
Figure 3:
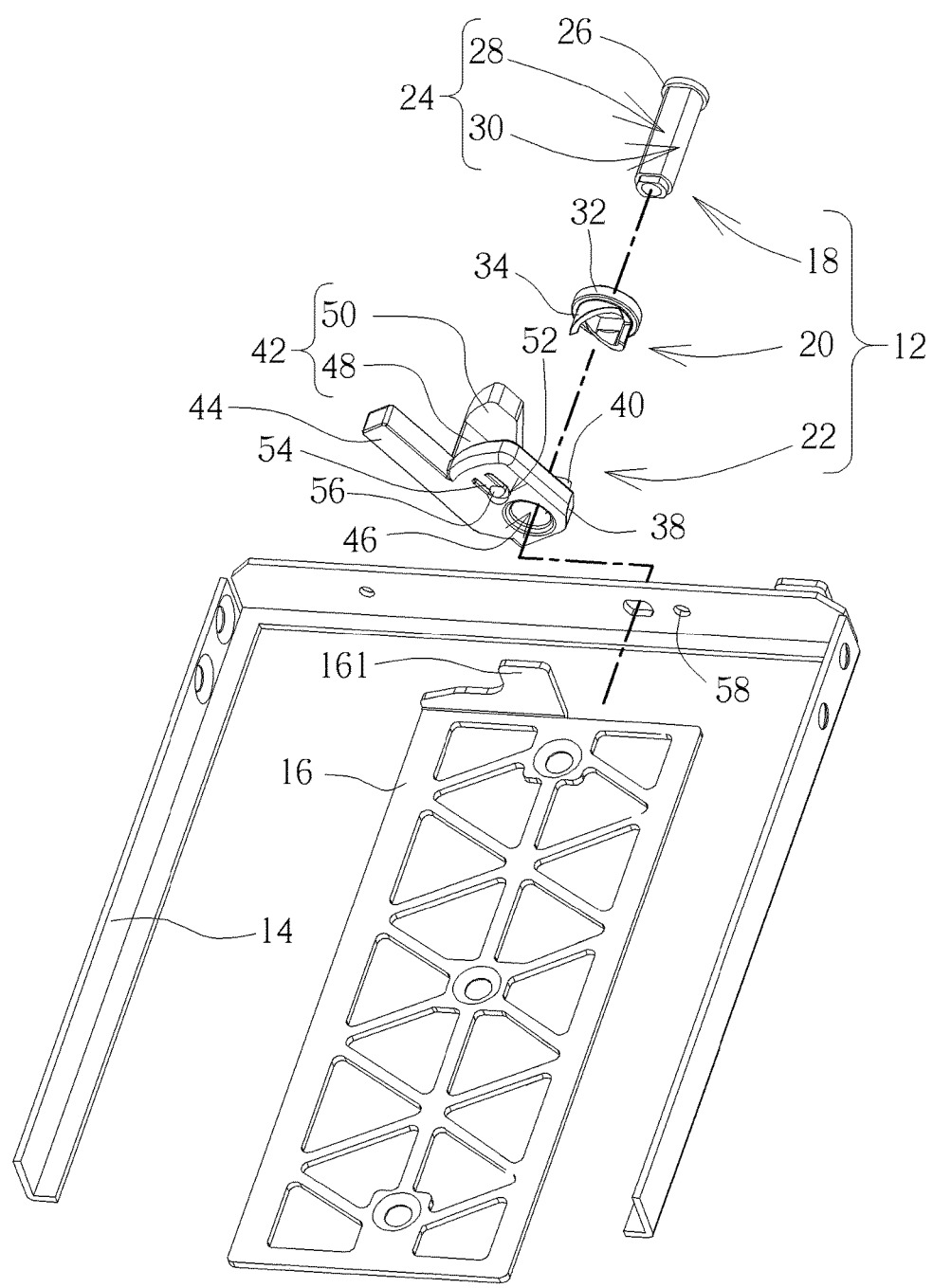

Please refer to FIG. 1 to FIG. 3. FIG. 1 is a diagram of an electronic apparatus 10 with a quick-releasing mechanism 12 according to an embodiment of the present disclosure.

FIG. 2 and FIG. 3 are exploded diagrams of the quick-releasing mechanism 12 in different views according to the embodiment of the present disclosure. The electronic apparatus 10 includes the quick-releasing mechanism 12, a fastening seat 14 and a bracket 16. The quick-releasing mechanism 12 is configured to conveniently assemble and disassemble an electronic device, and the bracket 16 is configured to connect with a storage device, a display card, an expansion card, or any other electronic device. For example, the bracket 16 may be used to fix the storage device (such as a hard disk) inside a casing of the electronic apparatus 10. The bracket 16 has a bridging portion 161, and the bridging portion 161 may be bent relative to a main body of the bracket 16 The bridging portion 161 may be laterally stretched to a top of the fastening seat 14 to cooperating with the quick-releasing mechanism 12 when the bracket 16 is moved-upward or moved-downward relative to the fastening seat 14. A user may rapidly assemble the bracket 16 with the fastening seat 14 via the quick-releasing mechanism 12 without using screw drivers or spanners.

The quick-releasing mechanism 12 may include a central axle 18, an ejecting component 20, and a locking component 22. The central axle 18 is disposed on the fastening seat 14. The central axle 18 may include an axle portion 24 and a contacting portion 26. The contacting portion 26 is disposed on a first end 241 of the axle portion 24, and a second end 242 of the axle portion 24 is disposed on the fastening seat 14 via a rivet or other components. The ejecting component 20 and the locking component 22 are movably disposed on the axle portion 24, and the contacting portion 26 is configured to prevent the ejecting component 20 and the locking component 22 from being separated apart from the central axle 18 through the first end 241 of the axle portion 24. The central axle 18 may include a positioning plane surface 28 and a rotating arc surface 30 connected with each other. The positioning plane surface 28 and the rotating arc surface 30 are formed on an outer surface of the axle portion 24. The ejecting component 20 may include a supporting portion 32 and a first inclined guiding structure 34, wherein the first inclined guiding structure 34 is disposed on a side of the supporting portion 32. The supporting portion 32 is configured with a non-circular constraining hole 36. When the ejecting component 20 is disposed on the central axle 18, an inner wall of the non-circular constraining hole 36 may slidably abut against the positioning plane surface 28, the ejecting component 20 may slide relative to the central axle 18 along a first direction D1 (indicating a longitudinally structural direction of the axle portion 24).

The locking component 22 may include a base 38, a second inclined guiding structure 40, a pressing portion 42, and a pushing portion 44. The base 38 may include an arc constraining hole 46, and an inner wall of the arc constraining hole 46 may slidably abut against the rotating arc surface 30. When the locking component 22 is disposed on the central axle 18, the arc constraining hole 46 of the base 38 may be rotated relative to the central axle 18 via the rotating arc surface 30 along a second direction D2. The second inclined guiding structure 40 is disposed on the base 38 and slidably abuts against the first inclined guiding structure 34. When the locking component 22 is rotated, the second inclined guiding structure 40 and the first inclined guiding structure 34 are configured to lift and lower-down the supporting portion 32, so as to change a height of the ejecting component 20 relative to the fastening seat 14. The pressing portion 42 is disposed on the base 38. The supporting portion 32 of the ejecting component 20 may support a bottom of the bridging portion 161 of the bracket 16, and the pressing portion 42 may press-down the bridging portion 161 of the bracket 16. That is, the bridging portion 161 of the bracket 16 is clipped between the supporting portion 32 and the pressing portion 42.

The pressing portion 42 may include a supporting unit 48 and a stretching unit 50. A first end 481 of the supporting unit 48 is connected to the base 38, and the stretching unit 50 is disposed on a second end 482 of the supporting unit 48. The stretching unit 50 may be stretched from the supporting unit 48 toward an orientation whereon the second inclined guiding structure 40 is located, and be suspended above the base 38. When the ejecting component 20 is connected to the second inclined guiding structure 40 by the first inclined guiding structure 34 and the stretching unit 50 of the pressing portion 42 is located above the bridging portion 161 of the bracket 16, the stretching unit 50 may be cooperated with the supporting portion 32 to clip two opposite surfaces of the bridging portion 161 of the bracket 16. The pushing portion 44 is connected to a lateral side of the base 38. The user may push the pushing portion 44 to rotate the locking component 22, and the second inclined guiding structure 40 may slide relative to the first inclined guiding structure 34.

Besides, the locking component 22 further may include a buffering slot structure 52 and a resilient arm portion 54. The buffering slot structure 52 is formed on the base 38 and is adjacent to (but not connected with) the arc constraining hole 46. One end of the resilient arm portion 54 is connected to an inner wall of the buffering slot structure 52, and a positioning protrusion 56 is disposed on the other end of the resilient arm portion 54. The fastening seat 14 may further include a positioning sunken slot 58 corresponding to the positioning protrusion 56. When the locking component 22 is rotated relative to the fastening seat 14 and reaches a specific angle, the positioning protrusion 56 of the resilient arm portion 54 may be engaged with the positioning sunken slot 58, and the locking component 22 may be constrained at the specific angle due to structural interference and frictional resistance.

Figure 4:
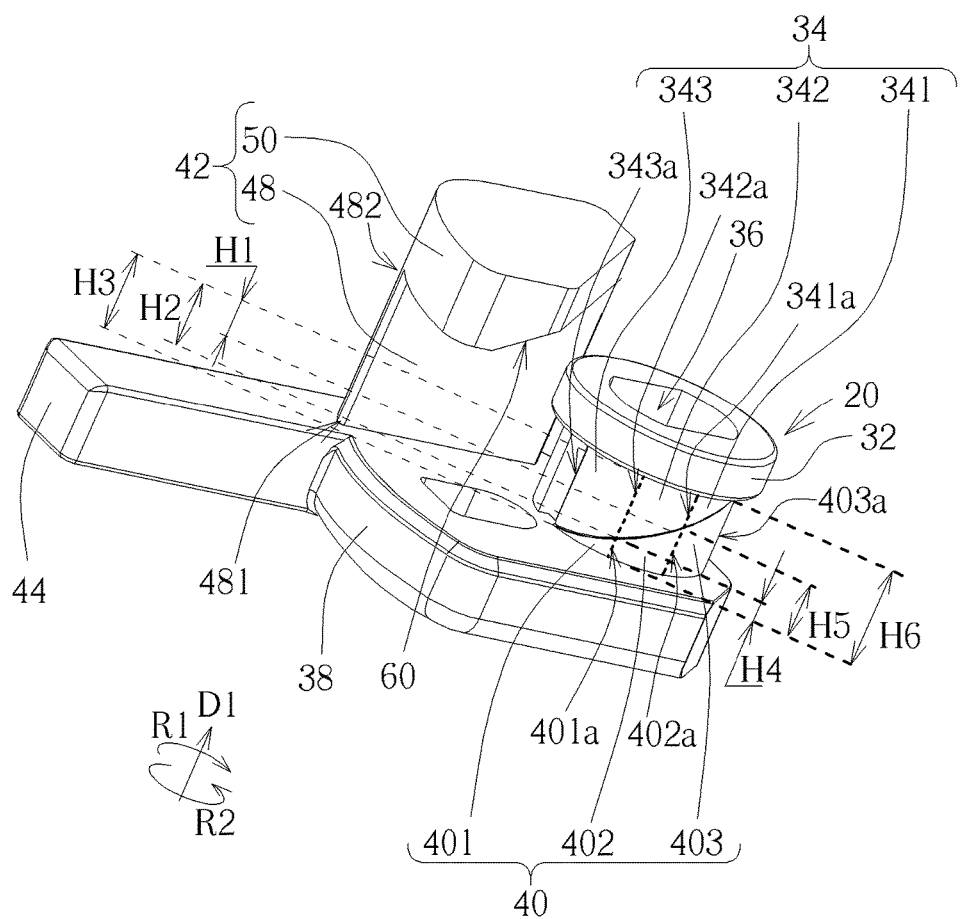
FIG. 4 is an enlarged diagram of the quick-releasing mechanism according to the embodiment of the present disclosure.

Please refer to FIG. 4. FIG. 4 is an enlarged diagram of the quick-releasing mechanism 12 according to the embodiment of the present disclosure. The first inclined guiding structure 34 of the ejecting component 20 may include a plurality of regions, such as a first region 341, a second region 342 and a third region 343 adjacent to each other. A second protruding height H2 of a first side 342a of the second region 342 relative to the supporting portion 32 is set between a first protruding height H1 of a first side 341a of the first region 341 relative to the supporting portion 32 and a third protruding height H3 of a first side 343a of the third region 343 relative to the supporting portion 32. In addition, the second inclined guiding structure 40 of the locking component 22 may include a plurality of regions, such as a fourth region 401, a fifth region 402 and a sixth region 403 adjacent to each other. A fifth protruding height H5 of a first side 402a of the fifth region 402 relative to the base 38 is higher than a fourth protruding height H4 of a first side 401a of the fourth region 401 relative to the base 38, and the fifth protruding height H5 of the first side 402a of the fifth region 402 relative to the base 38 is lower than a sixth protruding height H6 of a first side 403a of the sixth region 403 relative to the base 38.

In another embodiment, number of regions of the first inclined guiding structure 34 and the second inclined guiding structure 40 are not limited to the above-mentioned embodiments, and may depend on design demand. The number of regions of the first inclined guiding structure may be the same with or different from the number of regions of the second inclined guiding structure, that is, any assemblies of the inclined guiding structures having the adjacent regions with gradually increased (or gradually decreased) height belongs to a scope of the present disclosure. Thus, when the locking component 22 is rotated relative to the central axle 18 along a clockwise direction R1, the third region 343 of the first inclined guiding structure 34 may be moved from a position aligning with the fourth region 401 to a position aligning with the fifth region 402, and then be moved to a position aligning with the sixth region 403. As such, the supporting portion 32 may be lifted accordingly. When the locking component 22 is rotated relative to the central axle 18 along a counterclockwise direction R2, the third region 343 may be moved from the position aligning with the sixth region 403 to the position aligning with the fifth region 402, and then be moved to the position aligning with the fourth region 401. As such, the supporting portion 32 may be lowered-down accordingly.

Figure 5:
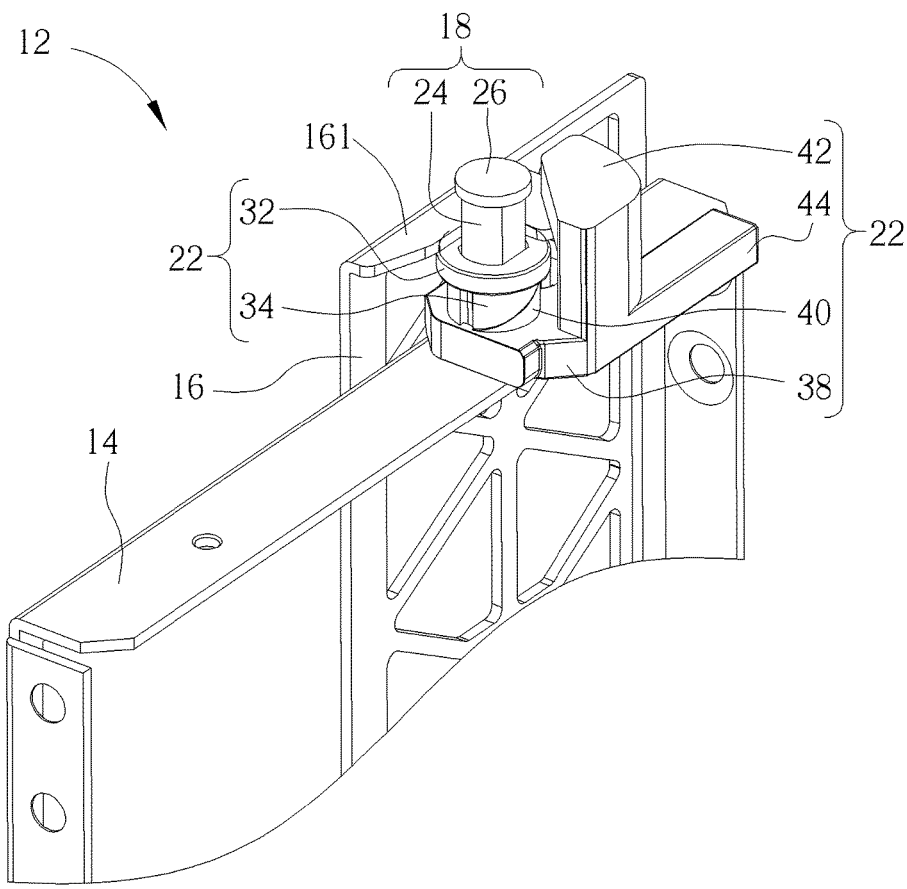
FIG. 5 and FIG. 6 are diagrams illustrating the quick-releasing mechanism switched into a locking mode in different views according to the embodiment of the present disclosure.
Figure 6:
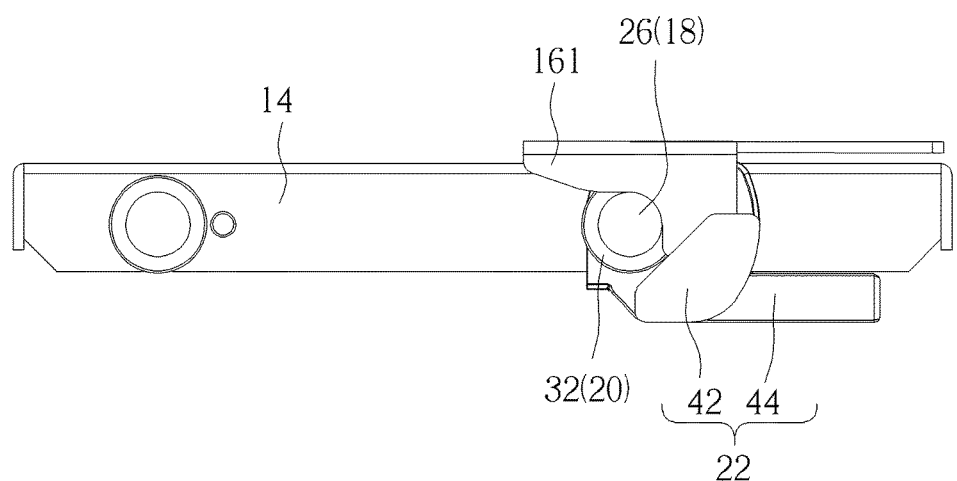
Figure 7:
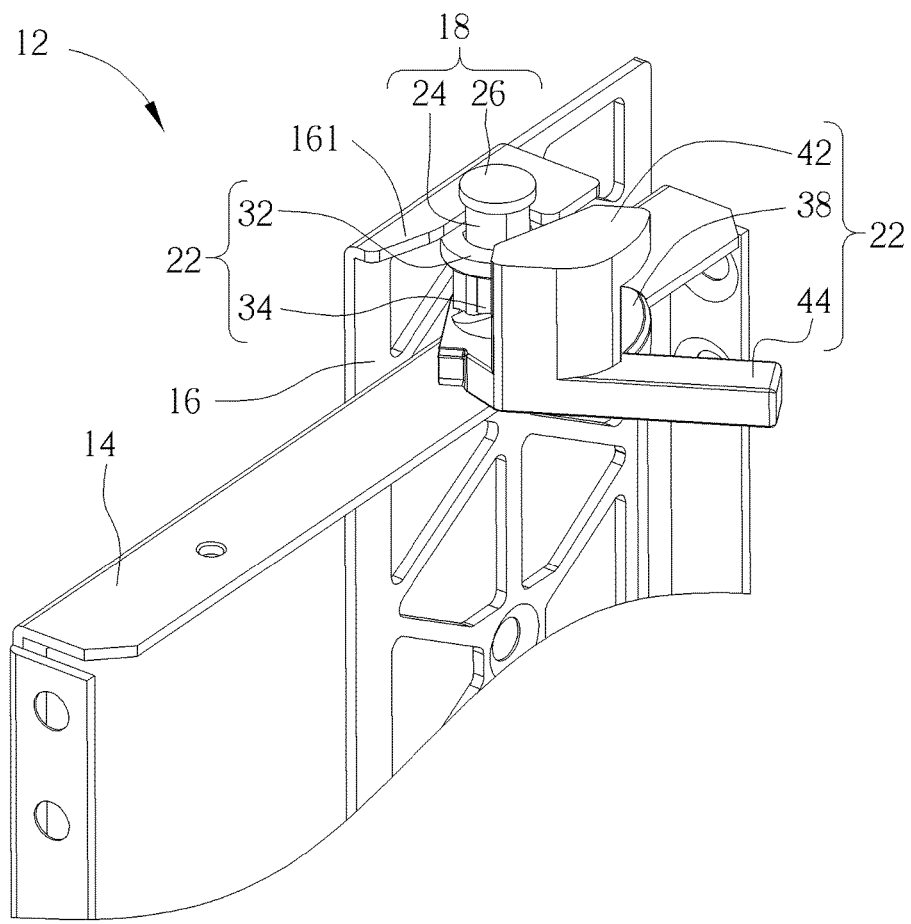
FIG. 7 and FIG. 8 are diagrams illustrating the quick-releasing mechanism switched into a relay mode in different views according to the embodiment of the present disclosure.
Figure 8:
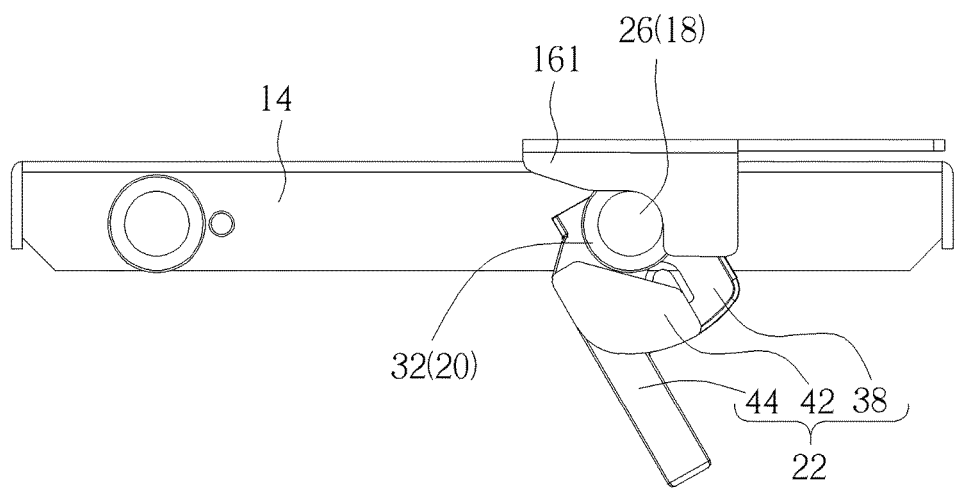
Figure 9:
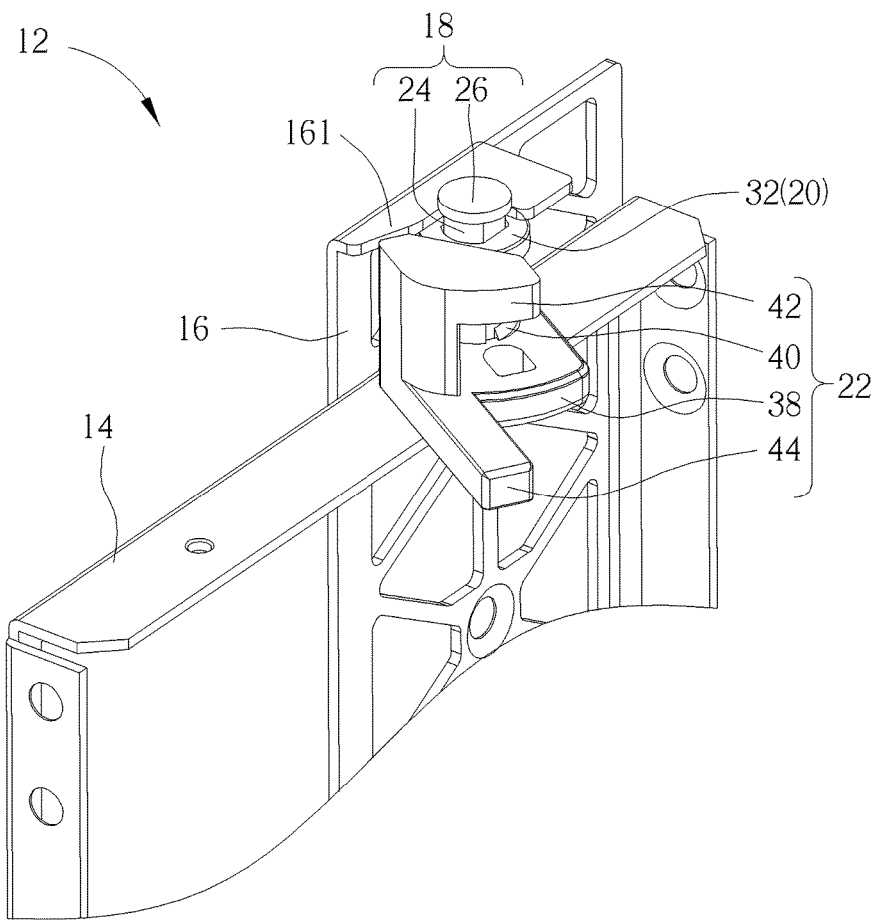
FIG. 9 and FIG. 10 are diagrams illustrating the quick-releasing mechanism switched into an unlocking mode in different views according to the embodiment of the present disclosure.
Figure 10:
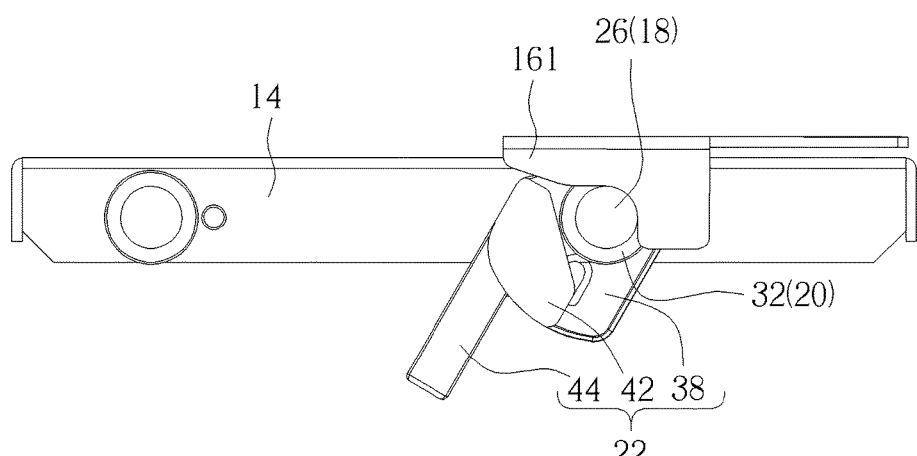

Please refer to FIG. 5 to FIG. 10. FIG. 5 and FIG. 6 are diagrams illustrating the quick-releasing mechanism 12 switched into a locking mode in different views according to the embodiment of the present disclosure. FIG. 7 and FIG. 8 are diagrams illustrating the quick-releasing mechanism 12 switched into a relay mode in different views according to the embodiment of the present disclosure. FIG. and FIG. 10 are diagrams illustrating the quick-releasing mechanism 12 switched into an unlocking mode in different views according to the embodiment of the present disclosure. As the locking mode shown in FIG. 5 and FIG. 6, the locking component 22 fully abuts against (or press down) the bridging portion 161, and the third region 343 of the first inclined guiding structure 34 aligns with the fourth region 401 of the second inclined guiding structure 40. The supporting portion 32 is located at lowest position, and the bracket 16 is clipped by the supporting portion 32 and the pressing portion 42 of the locking component 22, as such the bracket 16 may be stably assembled inside the fastening seat 14. As the user intends to remove the bracket 16, the user may push the pushing portion 44 to rotate the locking component 22 relative to the central axle 18, as shown in FIG. 7 and FIG. 8, and the positioning protrusion 56 of the resilient arm portion 54 may be moved-out from the positioning sunken slot 58. When the locking component 22 is rotated and the pressing portion 42 begins to separate apart from the bridging portion 161 (but the pressing portion 42 still abuts against the bridging portion 161), the quick-releasing mechanism 12 is in the relay mode. The third region 343 of the first inclined guiding structure 34 may align with the fifth region 402 of the second inclined guiding structure 40, and the ejecting component 20 may slide upward relative to the central axle 18. As such, the pressing portion 42 of the locking component 22 may be gradually separated apart from the bridging portion 161 of the bracket 16.

In some embodiment of the present disclosure, the pressing portion 42 may include a guiding surface structure 60 formed on an edge of the stretching unit 50 facing toward the ejecting component 20. When the locking component 22 is rotated and the pressing portion 42 begins to separate apart from the bridging portion 161 (but the pressing portion 42 still abuts against the bridging portion 161), the ejecting component 20 may move the bridging portion 161 of the bracket 16 upward and abut against the guiding surface structure 60. That is, the bridging portion 161 may be moved upward when the stretching unit 50 is partly overlapped with the bridging portion 161.

In another embodiment of the present disclosure, a gap may be pre-formed between the first inclined guiding structure 34 and the second inclined guiding structure 40. The pre-formed gap represents that the second inclined guiding structure 40 needs to be slightly rotated before abutting against the first inclined guiding structure 34. When the locking component 22 is rotated to switch from the locking mode to the unlocking mode, the pressing portion 42 may be separated apart from the bridging portion 161 by configuration of the pre-formed gap, and then the locking component 22 may be further rotated to drive the supporting portion 32 of the ejecting component 20 to push the bracket 16 upward. Therefore, the quick-releasing mechanism 12 of the present disclosure may directly lift the bracket 16 by the ejecting component 20 when the locking component 22 is rotated, or may lift the bracket 16 upward by the ejecting component 20 after rotating the locking component 22 to the specific angle, i.e., the locking component 22 is rotated to the specific angle for filling the pre-formed gap to abut the first inclined guiding structure 34 against the second inclined guiding structure 40.

After that, the user may continuously push the pushing portion 44 and move the pushing portion 44 to the unlocking mode. That is, the ejecting component 20 may continue to push the bracket 16 upward when the pressing portion 42 is fully separated apart from the bridging portion 161. As shown in FIG. 9 and FIG. 10, the locking component 22 is rotated to the maximum angle, and the pressing portion 42 of the locking component 22 is fully separated apart from the bridging portion 161 of the bracket 16. Due to the third region 343 of the first inclined guiding structure 34 is moved from the position aligning with the fifth region 402 to the position aligning with the sixth region 403 of the second inclined guiding structure 40, the ejecting component 20 may be lifted to the highest position, and the user may remove the bracket 16 from the fastening seat 14, wherein the bracket 16 may not be constrained by the locking component 22 and may be pushed upward by the ejecting component 20. Further, for assembling the bracket 16, the user may put the bracket 16 into the fastening seat 14 when the quick-releasing mechanism 12 is set in the unlocking mode. The bracket 16 may contact the ejecting component 20. The user may continue to press down the ejecting component 20 to drive the first inclined guiding structure 34 to push the second inclined guiding structure 40 and to switch the locking component 22 from the unlocking mode to the relay mode (as shown in FIG. 9 to FIG. 7) and further to the locking mode (as the embodiments shown in FIG. 7 to FIG. 5). As such, assembly of the bracket 16 may be operated rapidly and accurately.

In view of the above, the ejecting component of the quick-releasing mechanism and the related electronic apparatus of the present disclosure is disposed on the central axle in a slidable manner and the locking component is further disposed on the central axle in a rotatable manner. Clockwise and counterclockwise rotation between the locking component and the central axle may lift and lower-down the ejecting component relative to the central axle. The locking component further includes the pressing portion configured to clip the bracket with the ejecting component As such, the user may push the locking component to rapidly remove or fix the bracket. Assembly of the quick-releasing mechanism and the related electronic apparatus may be achieved without external tools and complicated process.

Those skilled in the art will readily observe that numerous modifications and alterations of the device and method may be made when retaining the teachings of the invention.

Accordingly, the above disclosure should be construed as limited only by the metes and bounds of the appended claims.

What is claimed is:

1. A quick-releasing mechanism, comprising:
   a central axle;
   an ejecting component slidably disposed on the central axle, wherein the ejecting component comprises:
   a supporting portion configured to support a bracket; and
   a first inclined guiding structure disposed under the supporting portion;
   a locking component, comprising: a base;
   a second inclined guiding structure disposed on the base and slidably abutting against the first inclined guiding structure to lift and lower-down the supporting portion;
   a pressing portion disposed on the base and configured to clip the bracket with the supporting portion; and a pushing portion disposed on a lateral side of the base, wherein the pushing portion is configured to rotate the locking component and drive the second inclined guiding structure to slide relative to the first inclined guiding structure;
   wherein the locking component is formed as a single unitary piece.

2. The quick-releasing mechanism of claim 1, wherein the central axle comprises a positioning plane surface and a rotating arc surface connected with each other, the supporting portion is slide relative to the central axle via the positioning plane surface along a first direction, and the base is rotated relative to the central axle via the rotating arc surface along a second direction different from the first direction.

3. The quick-releasing mechanism of claim 2, wherein the supporting portion comprises a non-circular constraining hole, and an inner wall of the non-circular constraining hole slidably abuts against the positioning plane surface.

4. The quick-releasing mechanism of claim 2, wherein the base comprises an arc constraining hole, and an inner wall of the arc constraining hole slidably abuts against the rotating arc surface.

5. The quick-releasing mechanism of claim 1, wherein the central axle comprises an axle portion and a contacting portion, the supporting portion and the base are movably disposed on the axle portion, the contacting portion is disposed on one end of the axle portion to abut against the supporting portion for preventing the supporting portion from being separated apart from the axle portion.

6. The quick-releasing mechanism of claim 1, wherein the first inclined guiding structure comprises a first region, a second region and a third region adjacent by each other, a second protruding height of a first side of the second region relative to the supporting portion is higher than a first protruding height of a first side of the first region relative to the supporting portion, and the second protruding height of the first side of the second region relative to the supporting portion is lower than a third protruding height of a first side of the third region relative to the supporting portion.

7. The quick-releasing mechanism of claim 6, wherein the second inclined guiding structure comprises a fourth region, a fifth region and a sixth region adjacent by each other, a fifth protruding height of a first side of the fifth region relative to the base is higher than a fourth protruding height of a first side of the fourth region relative to the base, and the fifth protruding height of the first side of the fifth region relative to the base is lower than a sixth protruding height of a first side of the sixth region relative to the base; the third region is moved from a position aligning with the fourth region to a position aligning with the fifth region or the sixth region to lift the supporting portion, the third region is moved from the position aligning with the sixth region to the position aligning with the fifth region or the fourth region to lower-down the supporting portion.

8. The quick-releasing mechanism of claim 1, wherein the pressing portion comprises a supporting unit and a stretching unit, one end of the supporting unit is disposed on the base, the stretching unit is stretched from the other end of the supporting unit facing toward the second inclined guiding structure, and the stretching unit is suspended above the base.

9. The quick-releasing mechanism of claim 1, wherein the locking component further comprises:
   a buffering slot structure formed on the base; and
   a resilient arm portion, one end of the resilient arm portion being connected to an inner wall of the buffering slot structure and the other end of the resilient arm portion having a positioning protrusion.

10. An electronic apparatus, comprising:
    a fastening seat;
    a bracket configured to fix at least one storage device; and
    a quick-releasing mechanism configured to detachably assemble the bracket with the fastening seat, wherein the quick-releasing mechanism comprises:
    a central axle disposed on the fastening seat;
    an ejecting component slidably disposed on the central axle, wherein the ejecting component comprises:
    a supporting portion configured to support the bracket; and
    a first inclined guiding structure disposed under the supporting portion;
    a locking component, comprising:
    a base;
    a second inclined guiding structure disposed on the base and slidably abutting against the first inclined guiding structure to lift and lower-down the supporting portion, so as to move the bracket into or out of the fastening seat;
    a pressing portion disposed on the base and configured to clip the bracket with the supporting portion; and
    a pushing portion disposed on a lateral side of the base, wherein the pushing portion is configured to rotate the locking component and drive the second inclined guiding structure to slide relative to the first inclined guiding structure.

11. The electronic apparatus of claim 10, wherein the central axle comprises a positioning plane surface and a rotating arc surface connected with each other, the supporting portion is slide relative to the central axle via the positioning plane surface along a first direction, and the base is rotated relative to the central axle via the rotating arc surface along a second direction different from the first direction.

12. The electronic apparatus of claim 11, wherein the supporting portion comprises a non-circular constraining hole, and an inner wall of the non-circular constraining hole slidably abuts against the positioning plane surface.

13. The electronic apparatus of claim 11, wherein the base comprises an arc constraining hole, and an inner wall of the arc constraining hole slidably abuts against the rotating arc surface.

14. The electronic apparatus of claim 10, wherein the central axle comprises an axle portion and a contacting portion, the supporting portion and the base are movably disposed on the axle portion, the contacting portion is disposed on one end of the axle portion to abut against the supporting portion for preventing the supporting portion from being separated apart from the axle portion.

15. An electronic apparatus, comprising: a fastening seat;
a bracket configured to fix at least one storage device; and
a quick-releasing mechanism configured to detachably assemble the bracket with the fastening seat, wherein the quick-releasing mechanism comprises:
a central axle disposed on the fastening seat; an ejecting component slidably disposed on the central axle, wherein the ejecting component comprises:
a supporting portion configured to support the bracket; and a first inclined guiding structure disposed under the supporting portion; a locking component, comprising:
a base;
a second inclined guiding structure disposed on the base and slidably abutting against the first inclined guiding structure to lift and lower-down the supporting portion, so as to move the bracket into or out of the fastening seat;
a pressing portion disposed on the base and configured to clip the bracket with the supporting portion; and
a pushing portion disposed on a lateral side of the base, wherein the pushing portion is configured to rotate the locking component and drive the second inclined guiding structure to slide relative to the first inclined guiding structure;
wherein the locking component is formed as a single unitary piece.

16. The electronic apparatus of claim 15, wherein the second inclined guiding structure comprises a fourth region, a fifth region and a sixth region adjacent by each other, a fifth protruding height of a first side of the fifth region relative to the base is higher than a fourth protruding height of a first side of the fourth region relative to the base, and the fifth protruding height of the first side of the fifth region relative to the base is lower than a sixth protruding height of a first side of the sixth region relative to the base; the third region is moved from a position aligning with the fourth region to a position aligning with the fifth region or the sixth region to lift the supporting portion, the third region is moved from the position aligning with the sixth region to the position aligning with the fifth region or the fourth region to lower-down the supporting portion.

17. The electronic apparatus of claim 10, wherein the pressing portion comprises a supporting unit and a stretching unit, one end of the supporting unit is disposed on the base, the stretching unit is stretched from the other end of the supporting unit facing toward the second inclined guiding structure, and the stretching unit is suspended above the base.

18. The electronic apparatus of claim 10, wherein the fastening seat comprises a positioning sunken slot, the locking component further comprises:
a buffering slot structure formed on the base; and
a resilient arm portion, one end of the resilient arm portion being connected to an inner wall of the buffering slot structure, and the other end of the resilient arm portion having a positioning protrusion utilized to engage inside the positioning sunken slot for constraining rotation of the locking component relative to the fastening seat.

* * * * *